United States Patent
Ye et al.

(10) Patent No.: US 8,226,257 B2
(45) Date of Patent: Jul. 24, 2012

(54) BACKLIGHT UNIT AND DISPLAY INCLUDING THE SAME

(75) Inventors: Byoung-Dae Ye, Yongin-si (KR); Gi-Cherl Kim, Youngin-si (KR); Byung-Choon Yang, Seoul (KR); Dong-Min Yeo, Daegu (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 966 days.

(21) Appl. No.: 12/243,620

(22) Filed: Oct. 1, 2008

(65) Prior Publication Data

US 2009/0207633 A1    Aug. 20, 2009

(30) Foreign Application Priority Data

Feb. 15, 2008  (KR) ........................ 10-2008-0014054

(51) Int. Cl.
*G09F 13/04* (2006.01)
(52) U.S. Cl. ...................................................... 362/97.1
(58) Field of Classification Search ................ 362/97.1, 362/97, 3, 612, 613; 315/291, 307, 209 R
See application file for complete search history.

(56) References Cited

U.S. PATENT DOCUMENTS

| | | | | |
|---|---|---|---|---|
| 5,278,432 | A * | 1/1994 | Ignatius et al. | 257/88 |
| 6,507,159 | B2 * | 1/2003 | Muthu | 315/307 |
| 6,566,824 | B2 * | 5/2003 | Panagotacos et al. | 315/291 |
| 7,180,252 | B2 * | 2/2007 | Lys et al. | 315/312 |
| 7,358,599 | B2 * | 4/2008 | Ohe et al. | 257/678 |
| 7,511,435 | B2 * | 3/2009 | Ye et al. | 315/291 |
| 7,648,254 | B2 * | 1/2010 | Yoo et al. | 362/249.01 |
| 7,744,233 | B2 * | 6/2010 | Moriyasu et al. | 362/97.3 |
| 7,825,613 | B2 * | 11/2010 | Ye et al. | 315/312 |
| 2003/0112627 | A1 * | 6/2003 | Deese | 362/249 |
| 2005/0035358 | A1 * | 2/2005 | Chung et al. | 257/88 |
| 2008/0012125 | A1 * | 1/2008 | Son | 257/724 |
| 2008/0111502 | A1 * | 5/2008 | Kim et al. | 315/294 |
| 2009/0086488 | A1 * | 4/2009 | Lynch et al. | 362/249.02 |

FOREIGN PATENT DOCUMENTS

JP  06237016 A  *  8/1994

\* cited by examiner

*Primary Examiner* — Ali Alavi
(74) *Attorney, Agent, or Firm* — F. Chau & Associates, LLC

(57) ABSTRACT

A backlight unit and a liquid crystal display including the same are provided. The backlight unit includes a circuit board, at least one internal interconnection formed on the circuit board, and a plurality of light emitting devices mounted to be connected with the at least one internal interconnection on the circuit board, each of the plurality of light emitting devices including at least one light emitting chip and at least one driving chip.

22 Claims, 5 Drawing Sheets

BACKLIGHT UNIT AND DISPLAY INCLUDING THE SAME

CROSS-REFERENCE TO RELATED APPLICATION

This application claims priority from Korean Patent Application No. 10-2008-0014054 filed on Feb. 15, 2008 in the Korean Intellectual Property Office, the contents of which are herein incorporated by reference in their entirety.

BACKGROUND OF THE INVENTION

1. Field of the Invention

The present disclosure is directed to a backlight unit and a liquid crystal display including the same, and more particularly to, a backlight unit having a light emitting device manufactured by forming a light emitting chip and a driving chip in the same package, and a display including the backlight unit.

2. Description of the Related Art

Flat panel displays, including liquid crystal displays (LCD), and plasma display panels (PDP), have replaced CRTs and have been rapidly developed. Since an LCD is not a self-luminescent display device, it requires a backlight unit supplying the LCD with light. Accordingly, the LCD is provided with a backlight unit below an LCD pane and displays an image using light emitted from the backlight unit. An example of a light source of the backlight unit spotlighted in recent years is a light emitting diode (LED).

A backlight unit is manufactured by mounting a plurality of light emitting diodes on a plane, and a power line for supplying power to the light emitting diodes and a ground line are formed on the plane. Thus, the light emitting diodes are mounted on the plane in such a way to be connected with the power line and the ground line. The backlight unit is structured such that a predetermined number of light emitting diodes form each block to reduce power consumption and the light emitting diodes are driven in a block-by-block basis. For example, a plurality of light emitting diodes can be arranged horizontally form each block.

To drive light emitting diodes in a block-by-block basis, a driving unit is required for each block. The driving unit controls a connection between a power terminal and a ground terminal for each block. Driving units are formed on a plane that is different from that on which the light emitting diodes are mounted, and the plane where the light emitting diodes are mounted and the plane where the driving units are mounted are connected for use. As a result, production cost increases due to manufacturing of the driving units on the separate plane and a failure may occur in the course of connecting the plane where the driving units are formed with the plane where the light emitting diodes are formed. Moreover, the volume of a backlight unit also increases due to the plane where the driving units are formed and a connection member for connecting the plane for the driving units with the plane on which the light emitting diodes are mounted.

SUMMARY OF THE INVENTION

Embodiments of the present invention provide a backlight unit, capable of addressing issued related to mounting light emitting diodes and driving units on different planes, and a display including the backlight unit.

Embodiments of the present invention also provide a backlight unit capable of simplifying a circuit and reducing production cost by forming a light emitting chip and a driving chip in the same package, and a display including the backlight unit.

In general, according to an embodiment of the invention, for a light emitting diode, a light emitting chip is mounted in a housing where an electrode terminal for receiving power is formed. The light emitting chip and the electrode terminal are connected by using a connection wire and then are molded. The light emitting chip occupies a small area in the housing. In other words, even after the light emitting chip is mounted and the electrode terminal is formed, a large area remains in the housing.

According to an embodiment of the present invention, a light emitting device is structured such that a light emitting chip and a driving chip are formed in the same package by mounting a light emitting chip and a driving chip with a space therebetween in a housing having a large remaining area and connecting the light emitting chip, the driving chip, and an electrode terminal by using a connection wire. The light emitting device is mounted on a circuit plane where a power line, a ground line, and a control line are formed. Here, the power line and the ground line are each formed as one piece regardless of the number of light emitting device blocks to connect all light emitting devices with each other and the number of control lines formed corresponds to the number of light emitting device blocks and the number of light emitting devices forming each of the light emitting device blocks.

The above and other features of embodiments of the present invention will be described in or be apparent from the following description of the exemplary embodiments.

According to an aspect of the present invention, there is provided a backlight unit including a circuit board, at least one internal interconnection formed on the circuit board, and a plurality of light emitting devices mounted on the circuit board to be connected with the at least one internal interconnection, each of the plurality of light emitting devices including at least one light emitting chip and at least one driving chip.

The internal interconnection includes a power line supplying power to the plurality of light emitting devices, a ground line connecting the plurality of light emitting devices to a ground terminal, and a plurality of control lines providing control signals to the plurality of light emitting devices.

Each of the power line and the ground line is configured as a line to connect the plurality of light emitting devices.

The plurality of control lines are connected with the plurality of light emitting devices, respectively.

Each of the plurality of light emitting devices includes at least one electrode terminal providing power and a control signal supplied from an external source to the light emitting chip and the driving chip, at least one interconnection connecting the light emitting chip, the driving chip, and the electrode terminal, and a molding unit encapsulating the light emitting chip and the driving chip.

The driving chip includes a switching device driven according to the control signal.

The light emitting chip has a first electrode connected with the power line and a second electrode connected with a first electrode of the driving chip, and the driving chip has a second electrode connected with the ground line and a third electrode connected with the control line.

The light emitting chip has a first electrode connected with the ground line and a second electrode connected with a first electrode of the driving chip, and the driving chip has a second electrode connected with the power line and a third electrode connected with the control line.

The driving chip may be driven according to the control signal wherein current flows between the power line and the ground line by means of the light emitting chip and the driving chip.

The molding unit may further include a fluorescent substance.

Each of the light emitting devices may be configured as a single package by forming a light emitting chip and a driving chip on different boards.

Each of the light emitting devices may be configured as a single package by forming a light emitting chip and a driving chip on the same substrate.

For each of the light emitting devices, a plurality of light emitting chips and a plurality of driving chips may be configured as a single package.

For each of the light emitting devices, a plurality of light emitting chips and a plurality of driving chips may be mounted on the circuit board and molded.

According to another aspect of the present invention, there is provided a backlight unit including a circuit board, at least one internal interconnection formed on the circuit board, a plurality of thin film transistors (TFTs) formed spaced apart from one another on a predetermined region of the circuit board and connected with the at least one internal connection, and a plurality of light emitting devices mounted on the circuit board to be connected with the at least one internal interconnection and the plurality of TFTs, each of the plurality of light emitting devices including at least one light emitting chip.

The internal interconnection may include a power line supplying power to the plurality of light emitting devices, a ground line connecting the plurality of TFTs to a ground terminal, and a plurality of control lines providing control signals to the plurality of TFTs.

Each of the plurality of TFTs may include a gate electrode connected with the control lines, a source electrode connected with the light emitting devices, and a drain electrode connected with the ground terminal.

According to still another aspect of the present invention, there is provided a display including a display panel for displaying an image, a backlight unit including a plurality of light emitting devices mounted on a circuit board to be connected with at least one internal interconnection on the circuit board, each of plurality of light emitting devices including at least one light emitting chip and at least one driving chip, to provide light to the display panel, and a backlight unit driving unit supplying power to the backlight unit and adjusting a control signal provided to the backlight unit.

Each of the light emitting devices may be configured as a single package by forming a light emitting chip and a driving chip on different boards.

Each of the light emitting devices may be configured as a single package by forming a light emitting chip and a driving chip on the same substrate.

For each of the light emitting devices, a plurality of light emitting chips and a plurality of driving chips may be configured as a single package.

For each of the light emitting devices, a plurality of light emitting chips and a plurality of driving chips may be mounted on the circuit board and molded.

DETAILED DESCRIPTION OF EXEMPLARY EMBODIMENTS

Features of embodiments of the present invention and methods of accomplishing the same may be understood more readily by reference to the following detailed description of exemplary embodiments and the accompanying drawings. Embodiments of the present invention may, however, be embodied in many different forms and should not be construed as being limited to the embodiments set forth herein. In the drawings, the size and relative sizes of layers and regions may be exaggerated for clarity. It will be understood that when an element or layer is referred to as being "on," another element or layer, it can be directly on the other element or layer or intervening elements or layers may be present. Like reference numerals refer to like elements throughout the specification.

Figure 1:
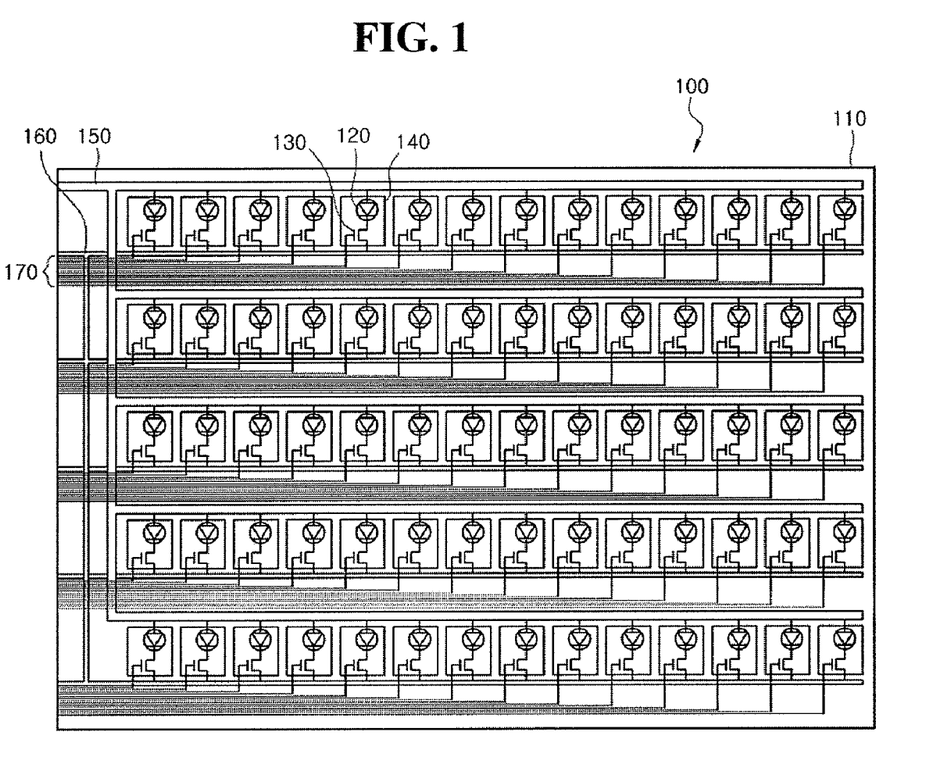
FIG. 1 is a plane schematic view of a light emitting device assembly constituting a backlight unit according to an embodiment of the present invention.
Figure 2:
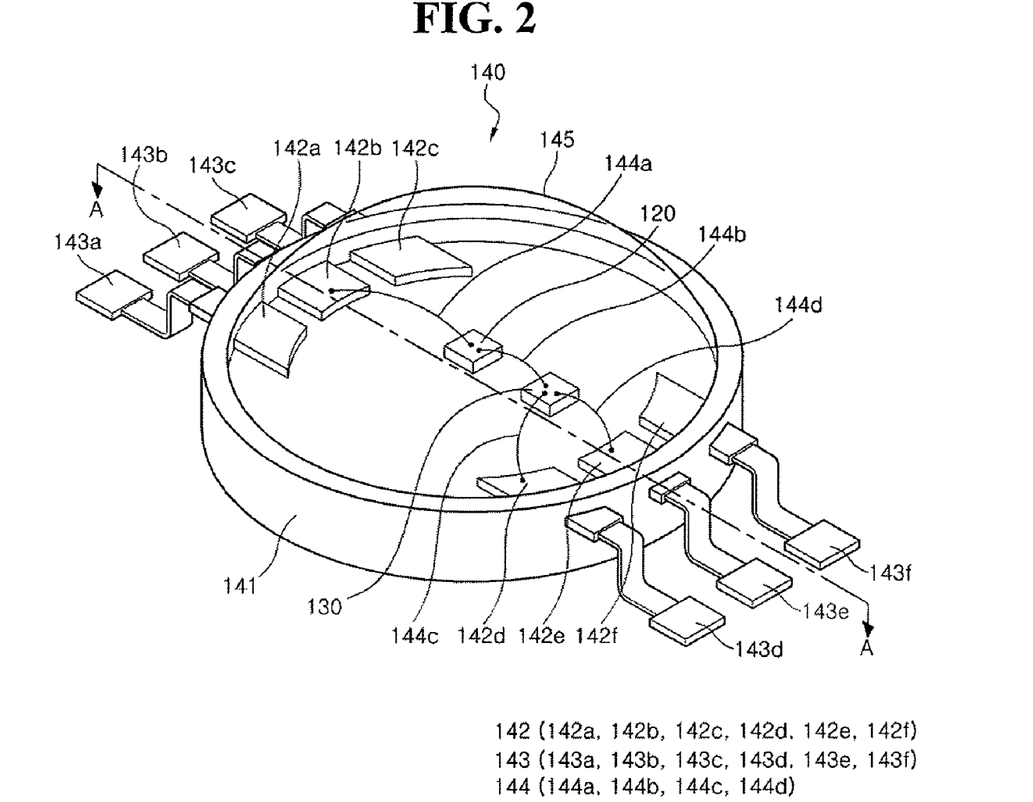
FIG. 2 is a perspective view of a light emitting device according to an embodiment of the present invention.
Figure 3:
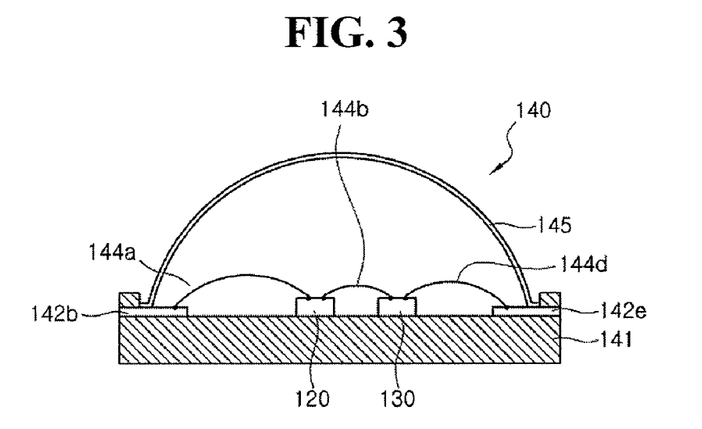
FIG. 3 is a cross-sectional view taken along a line A-A of FIG. 2.
Figure 4:
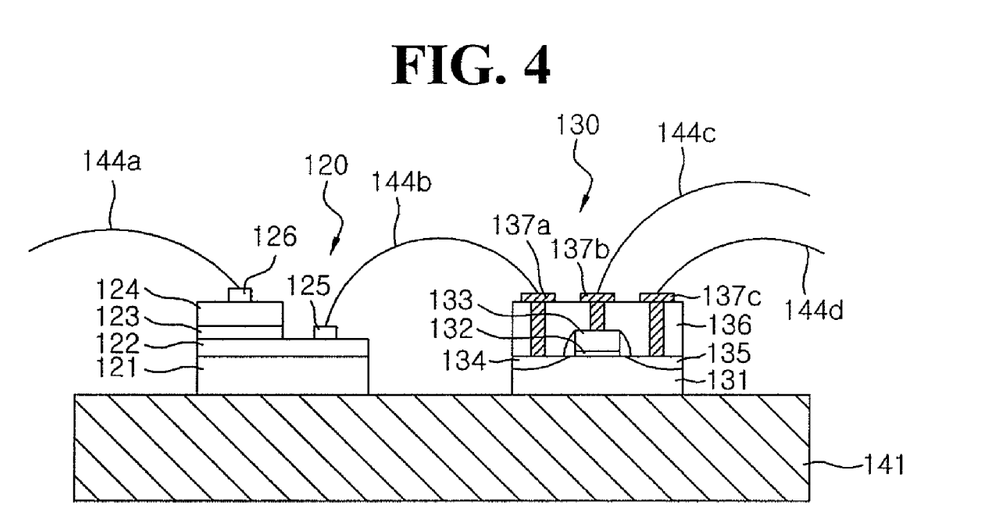
FIG. 4 is a cross-sectional view of a light emitting chip and a driving chip comprising a light emitting device according to an embodiment of the present invention.

FIG. 1 is a plane schematic view of a light emitting device assembly comprising a backlight unit according to an embodiment of the present invention, FIG. 2 is a perspective view of a light emitting device according to an embodiment of the present invention, FIG. 3 is a cross-sectional view taken along a line A-A of FIG. 2, and FIG. 4 is a cross-sectional view of a light emitting chip and a driving chip comprising a light emitting device according to an embodiment of the present invention.

Referring to FIG. 1, a light emitting device assembly 100 according to an embodiment of the present invention includes a circuit board 110, a plurality of light emitting devices 140 mounted on the circuit board 110, in each of which at least one light emitting chip 120 and at least one driving chip 130 are formed as a single package, and at least one internal connection wire for driving the plurality of light emitting devices 140. The internal connection wire includes a power line 150 which supplies power to the plurality of light emitting devices 120, a ground line 160 which connects the plurality of light emitting devices 140 with a ground terminal, and a plurality of control line units 170 which supply control signals for controlling the plurality of light emitting devices 140, respectively.

The circuit board 110 may be a multi-layered printed circuit board (PCB). The power line 150, the ground line 160, and the plurality of control line units 170 are formed on the circuit board 110 and are electrically insulated from each other. For example, when a multi-layered PCB is used as the circuit board 110, the ground line 160 may be formed on a lower layer of the circuit board 110 and the plurality of control line units 170 may be formed on an intermediate layer of the circuit board 110. The power line 150, the ground line 160, and the plurality of control line units 170 may be formed on different layers of the multi-layered PCB to be electrically insulated from one another. The power line 150 is connected with a plurality of light emitting devices 140 and the ground line 160 is also connected with the plurality of light emitting devices 140. In other words, the power line 150 and the ground line 160 are each formed as a line, and opposite ends of each of the plurality of light emitting devices 140 are connected with the power line 150 and the ground line 160, respectively. On the other hand, the number of control line units 170 may be determined to be equal to, for example, the number of blocks, each of which is composed of a predetermined number of simultaneously controlled light emitting devices. Each of the plurality of control line units 170 includes a plurality of control lines, and the number of control lines corresponds to the number of light emitting devices included in each block. Such a structure is intended for the plurality of control line units 170 to drive the plurality of light emitting devices 140 in a block-by-block basis. However, in this case, the control line units 170 may also separately drive the plurality of light emitting devices 140 using the plurality of control lines, instead of driving the plurality of light emitting devices 140 in the block-by-block basis.

Referring to FIGS. 2 and 3, each of the plurality of light emitting devices 140 includes a housing 141 where at least one light emitting chip 120 and at least one driving chip 130 are mounted, a plurality of internal electrode terminals 142*a-f* and a plurality of external electrode terminals 143*a-f* which supply power from an external source to the light emitting chip 120 and the driving chip 130, respectively, connection wires 144*a-d* which connects the light emitting chip 120 with the driving chip 130 and connects the light emitting chip 120 and the driving chip 130 with the internal electrode terminals 142*a-f*, and a molding unit 145 which seals the light emitting chip 120 and the driving chip 130. The housing 141 can be made of polyphthalamide (PPA), liquid crystal polymer (LCP), or thermal conductive resin, and the light emitting chip 120 is mounted in the center of the housing 141 and the driving chip 130 is mounted spaced apart from the light emitting chip 120. The light emitting chip 120 and the driving chip 130 are attached to a base of the housing 141 by means of an adhesive member (not shown). The internal electrode terminals 142*a-f* and the external electrode terminals 143*a-f* may be made of a metal material having superior electrical conductivity, e.g., silver-coated bronze copper steel plate. The external electrode terminals 143*a-f* are electrically connected with the power line 150, the ground line 160, and the plurality of control line units 170 of the circuit board 110 and the internal electrode terminals 142*a-f* deliver power and control signals applied through the external electrode terminals 143*a-f* to the light emitting chip 120 and the driving chip 130. For example, an external electrode terminal 143*b* is connected with the power line 150 of the circuit board 110, an external electrode terminal 143*e* is connected with the ground line 160 of the circuit board 110, and the external electrode terminal 143*d* is connected with the plurality of control lines 170 of the circuit board 110. The connection wires 144*a-d* connect the light emitting chip 120 with an internal electrode terminal 142*b*, connect the light emitting chip 120 with the driving chip 130, connects the driving chip 130 with an internal electrode terminal 142*d*, and connect the driving chip 130 with an internal electrode terminal 142*e*. The molding unit 145 encapsulates the light emitting chip 120 and the driving chip 130, and fixes the connection wires 144*a-d*. The molding unit 145 also functions as a lens which collects light generated by the light emitting chip 120. Since the molding unit 145 transmits light generated by the light emitting chip 120 to outside, it is typically formed of light transmitting resin such as epoxy resin or silicon resin. Here, the molding unit 145 may further include therein a diffuser (not shown) which uniformly emits light by diffusing light emitted from the light emitting chip 120. The diffuser may be made of barium titanate, titanium oxide, aluminum oxide, or silicon oxide. Further, the molding unit 145 may include a fluorescent substance (not shown). The fluorescent substance absorbs some of light generated by the light emitting chip 120 and emits light of a wavelength different from that of the absorbed light. The fluorescent substance is composed of active ions mixed with impurities in an appropriate position of a host lattice. The active ions determine a light emitting color by determining an energy gap between a ground state and an excited state of the active ions in a lattice structure. Herein, the light emitting chip 120 according to an embodiment of the present invention emits blue light, and may emit white light by introducing the fluorescent substance to the molding unit 145 of the blue light emitting chip 120. In addition, white light may be emitted by mixing a blue light emitting chip, a green light emitting chip, and a red light emitting chip. To this end, a blue (B) light emitting device, a green (G) light emitting device, and a red (R) light emitting device may be sequentially arranged.

Referring to FIG. 4, the light emitting chip 120 includes a first substrate 121, a first semiconductor layer 122 deposited on the first substrate 121, an active layer 123, and a second semiconductor layer 124 and is driven by power supplied from an external source to emit predetermined light. The light emitting chip 120 may further include a first electrode 125 formed on the first semiconductor layer 122 and a second electrode 126 formed on the second semiconductor layer 124. The first substrate 121 may be made of at least one selected from the group comprising $Al_2O_3$, SiC, ZnO, Si, GaAs, GaP, $LiAl_2O_3$, BN, AlN and GaN, and various other materials capable of a semiconductor layer. The first semiconductor layer 122 is a P-type semiconductor layer having a high concentration of holes by doping P-type impurities into an intrinsic semiconductor material such as GaAs, GaN, or SiC, while the second semiconductor layer 124 is an N-type semiconductor layer having a high concentration of electrons by doping N-type impurities into an intrinsic semiconductor material. The P-type semiconductor layer may be formed of a P-type clad layer and a P-type compound semiconductor layer. The N-type semiconductor layer may be formed of an N-type clad layer and an N-type compound semiconductor layer. Alternatively, the first semiconductor layer 122 may be formed of an N-type semiconductor layer and the second semiconductor layer 124 may be formed of a P-type compound semiconductor layer.

The active layer 123 is a region where a predetermined band gap and a quantum well are formed and electrons and positive holes are recombined. A light emitting wavelength generated by combination of the electrons and the positive holes changes according to a type of a material of the active layer 123. Thus, it is desirable to use a semiconductor material whose composition is controlled according to an intended wavelength for the active layer 123. The first and second electrodes 125 and 126 may be made of metal coming into ohmic contact with the first and second semiconductor layers 122 and 124, e.g., Ge, Ni, Au, or an alloy thereof. An electrode (not shown) for a bonding pad may be formed at a predetermined location on each of the first and second electrodes 125 and 126 using Cr, Au, or an alloy thereof. The bonding pad electrode is a portion corresponding to a potential contact point during formation of the connection wires 144*a-d*. That is, the bonding pad electrode allows the connection wires 144*a-d* to be securely bonded to the first and second electrodes 125 and 126.

Referring to FIG. 4, the driving chip 130 is a device driven according to a control signal, e.g., a transistor such as a field effect transistor (FET) or a bipolar junction transistor (BJT) or other switching devices. For example, when the driving chip 130 is a FET, it includes a gate insulating layer 132 and a gate electrode 133 which are formed on a second substrate 131, a source electrode 134 and a drain electrode 135 formed on the second substrate 131 at both sides of the gate electrode 133, and a pad electrode 137 (137a, 137b, 137c) connected with the gate electrode 133, the source electrode 134, and the drain electrode 135, respectively. The second substrate 131 is made of a conductive material doped with impurities, e.g., a semiconductor material such as Si, or Ge. The gate electrode 133 is formed on part of a surface of the second substrate 131 as a single layer or a multiple layer made of a conductive material such as polysilicon or metal. In addition, the gate insulating layer 132 disposed under the gate electrode 133 may be formed as a single layer or a multiple layer made of at least one of silicon oxide ($SiO_2$) and silicon nitride (SiNx). The source electrode 134 and the drain electrode 135 are formed on the second substrate 131 at both sides of the gate electrode 133 by injecting P-type or N-type impurities. The pad electrodes 137a-c are formed by forming a conductive material in such a way to be connected with each of the gate electrode 133, the source electrode 134, and the drain electrode 135 which are exposed by a predetermined region of an insulating layer 136 formed on the second substrate 131.

In the light emitting device assembly 100 structured as described above according to an embodiment of the present invention, the external electrode terminal 143b of the light emitting device 140 is connected with the power line 150 on the circuit board 110, the external electrode terminal 143e is connected with the ground line 160, and the external electrode terminal 143d is connected with the control line unit 170. Thus, the second semiconductor layer 124 of the light emitting chip 120 is provided with power through the external electrode terminal 143b, connection wire 144a, and the second electrode 126. The drain electrode 135 of the driving chip 130 is provided with ground power through the external electrode terminal 143e, connection wire 144d, and the electrode pad 137c. The gate electrode 133 of the driving chip 130 is provided with a control signal through the external electrode terminal 143d, connection wire 144c, and the electrode pad 137b. Here, the first electrode 125 of the light emitting chip 120 is connected with the source electrode 134 of the driving chip 130 through the connection wire 144b and the electrode pad 137a. Thus, the light emitting chip 120 and the driving chip 130 are connected between the power line 150 and the ground line 160, and when current flows between the power line 150 and the ground line 160 according to a control signal applied through the control line unit 170, the light emitting chip 120 is driven to emit predetermined light. In other words, for example, when the plurality of light emitting devices 140 are connected to the power line 150 and the ground line 160 to supply power to the light emitting chip 120, and the drain electrode 135 of the driving chip 130 is connected with a ground terminal, and a high-level pulse of a predetermined wavelength is applied through the control line unit 170 connected with a light emitting device block, the gate electrode 133 of the driving chip 130 is turned on and thus current flows between the power line 150 and the ground line 160. In this way, the light emitting chip 120 emits light of a predetermined wavelength.

Figure 5:
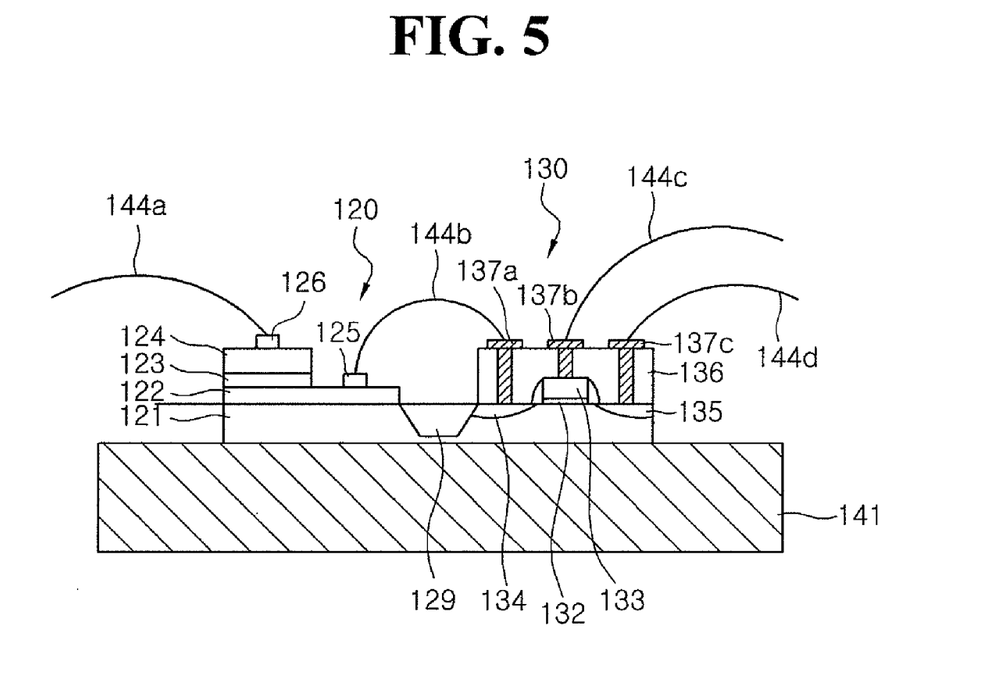
FIG. 5 is a cross-sectional view of a light emitting chip and a driving chip comprising a light emitting device according to another embodiment of the present invention.

In an embodiment of the present invention, after the light chip 120 and the driving chip 130 are manufactured by different manufacturing processes, they are mounted in the same housing 141 as one package to form the light emitting device 140. However, the light emitting chip 120 and the driving chip 130 may also be formed on the same plane and then be mounted in the housing 141 to form the light emitting device 140. For example, as illustrated in FIG. 5, after a device separation film 129 is formed on a predetermined region of the first substrate 121, the light emitting chip 120 may be manufactured on the first substrate 121 on a side of the device separation film 129 and the driving chip 130 may be manufactured on the first substrate 121 on the other side of the device separation film 129. A manufacturing process for the light emitting chip 120 and a manufacturing process for the driving chip 130 may be performed simultaneously or sequentially.

While an embodiment of the present invention has been described with regard to a field effect transistor (FET) as a driving element by way of example, embodiments of the invention can also be applied to various driving elements including a thin film transistor (TFT), particularly a top gate type TFT.

In addition, in an embodiment of the present invention, power is supplied to the light emitting chip 120 and the driving chip 130 is connected with a ground terminal. In this case, the source electrode 134 and the drain electrode 135 of the driving chip 130 are formed by injecting N-type impurities. In other words, the driving chip 130 is an NMOS transistor. However, power may be supplied to the driving chip 130 and the light emitting chip 120 may be connected with the ground terminal. In this case, the source electrode 134 and the drain electrode 135 of the driving chip 130 are formed by injecting P-type impurities. In other words, the driving chip 130 is a PMOS transistor. Here, a control signal applied to the gate electrode 133 of the driving chip 130 may apply a negative-polarity voltage.

In an embodiment of the present invention, after the light emitting chip 120 and the driving chip 130 of the light emitting device 140 are formed on different substrates and then are mounted in the same housing 141 or formed on the same substrate and then are mounted in the same housing 141, and the plurality of light emitting devices 140 are mounted on the circuit board 110. However, the housing 141 may have a size corresponding to the size of a light emitting device block, the plurality of light emitting chips 120 and the plurality of driving chips 130 may be mounted in the housing 141, and then each of the light emitting chips 120 and each of the driving chips 130 may be connected by using an interconnection and molded, and a package corresponding to the formed light emitting device block may be mounted on the circuit board 110. The light emitting chip 120 and the driving chip 130 may be mounted on the circuit board 110, and the light emitting chip 120 and the driving chip 130 may be connected with the power line 150, the ground line 160, and the control line unit 170 by using an interconnection and molded.

A thin film transistor (TFT) may be formed on a portion of the circuit board 110 without manufacturing the driving chip 130. In other words, the TFT may be formed on a region illustrated in FIG. 1 where the driving chip 130 is formed. The TFT includes a gate electrode, a source electrode, and a drain electrode and may be formed as a bottom gate type where a gate insulating layer, an active layer, and an ohmic contact layer are formed between the gate electrode, the source electrode and the drain electrode. In this case, the gate electrode of the TFT may be connected with the control line unit 170 illustrated in FIG. 1, the source electrode may be connected with the first electrode 125 of the light emitting chip 120 through an external interconnection, and the drain electrode may be connected with the ground line 160 illustrated in FIG. 1. Here, the gate electrode may be in contact with the control line unit 170 because the control line unit 170 is formed on the intermediate layer of the circuit board 110, and the drain electrode may be in contact with the ground line 160 because the ground line 160 is formed on the lower layer of the circuit board 110. In this case, the light emitting chip 120 is mounted on the housing 141 and molded by the molding unit 145, and is mounted on the circuit board 110 by means of the external electrode terminal 143.

Figure 6:
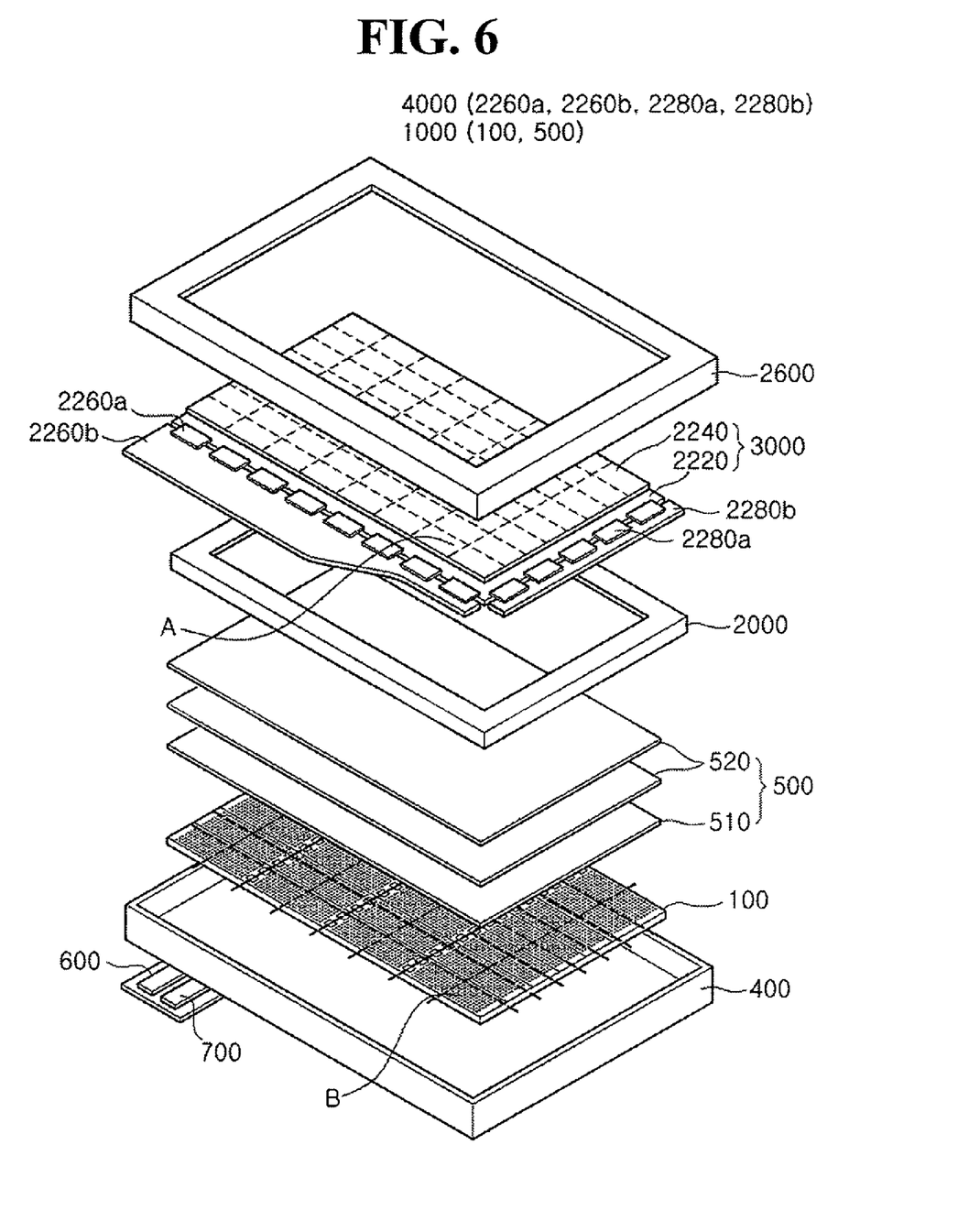
FIG. 6 is a schematic exploded perspective view of a liquid crystal display including a backlight unit using light emitting devices according to an embodiment of the present invention.
Figure 7:
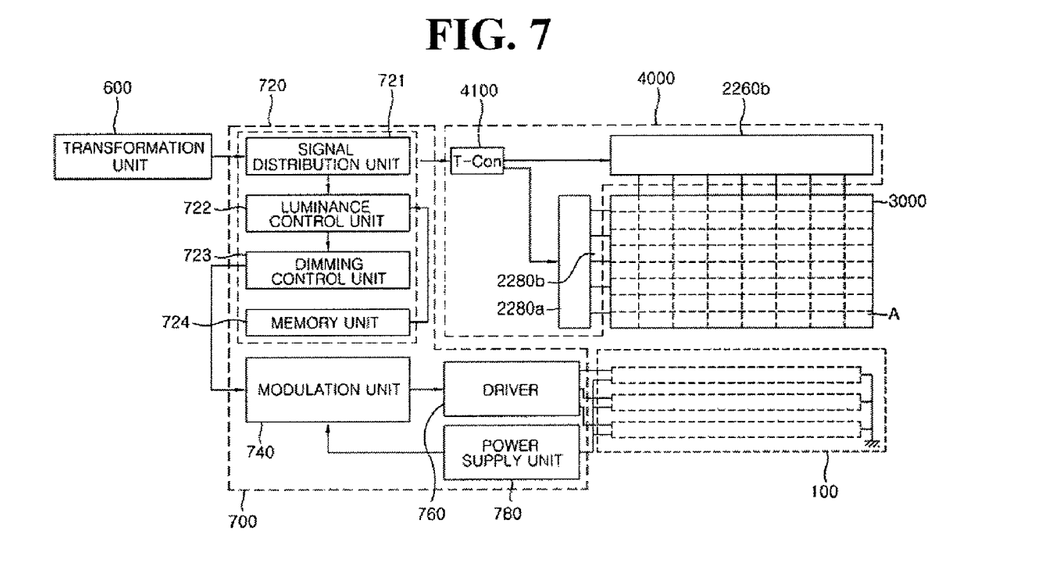
FIG. 7 is a block diagram of a liquid crystal display according to an embodiment of the present invention.

FIG. 6 is a schematic exploded perspective view of a liquid crystal display including a backlight unit using light emitting devices according to an embodiment of the present invention, and FIG. 7 is a block diagram of a liquid crystal display according to an embodiment of the present invention.

Referring to FIGS. 6 and 7, a liquid crystal display according to an embodiment of the present invention includes a liquid crystal display panel assembly including a liquid crystal panel 3000 and a liquid crystal panel driving unit 4000 for driving the liquid crystal panel 3000 and a backlight unit assembly including a backlight unit 1000 for supplying light to the liquid crystal display panel 3000 and a backlight unit driving unit 700 for driving the backlight unit 1000. The liquid crystal display may further include an upper receiving member 2600 and a lower receiving member 400 for receiving and protecting the liquid crystal display panel assembly and the backlight unit assembly, respectively. The liquid crystal display panel 3000 may be divided into a plurality of liquid crystal display panel blocks A which are virtual block regions in a matrix form, each having a particular size, and are defined by a predetermined number of data lines and a predetermined number of gate lines. For the backlight unit 1000, a light emitting device assembly 100 may also be divided into a plurality of light emitting device blocks B to correspond with the plurality of liquid crystal display panel blocks A. Each of the light emitting device blocks B may be composed of, for example, a predetermined number of light emitting devices arranged horizontally and vertically, or a predetermined number o flight emitting devices arranged horizontally.

The liquid crystal display panel assembly includes a TFT board 2220, a color filter board 2240 corresponding to the TFT board 2220, the liquid crystal display panel 3000 including a liquid crystal layer (not shown) injected between the TFT board 2220 and the color filter board 2240, and a liquid crystal display panel driving unit 4000 for driving the liquid crystal panel 3000. The liquid crystal display panel 3000 may further include polarizing plates (not shown) formed on the color filter board 2240 and under the TFT board 2220.

The TFT board 2220 includes a gate line extending in one direction, a data line extending in the other direction, TFTs formed in a matrix form in a region where the gate line and the data line intersect, and a pixel electrode. The TFTs include a gate terminal, a source terminal, and a drain terminal. In the TFTs, the gate terminal is connected with the gate line, the source terminal is connected with the data line, and the drain terminal is connected with the pixel electrode. In the TFT board 2220, upon input of an electric signal to the gate line and the data line, each of the TFTs is turned on or off and thus a signal required for pixel formation is applied to the drain terminal, thereby displaying an image.

In the color filter board 2240, red (R), green (G), and blue (B) pixels, which are color pixels expressing predetermined colors, are formed by light transmission through a transparent board. A common electrode formed of a transparent conductor film, which is made of a transparent conductor, such as indium tin oxide (ITO) or indium zinc oxide (IZO), is formed over the entire surface of the color filter board 2240.

The liquid crystal display panel driving unit 4000 includes a data tape carrier package (TCP) 2260a and a gate TCP 2280a connected with the TFT board 2220, and a data PCB 2260b and a gate PCB 2280b connected with the data TCP 2260a and the gate TCP 2280a, respectively, to drive the liquid crystal display panel 3000.

The backlight unit assembly includes the backlight unit 1000 and the backlight unit driving unit 700 to supply light to the liquid crystal display panel 3000. The backlight unit 1000 includes the light emitting device assembly 100 having a plurality of light emitting devices, in each of which a light emitting chip and a driving chip are configured as a single package, and an optical sheet 500 for improving the quality of light emitting from the plurality of light emitting devices. In addition, the backlight unit assembly may further include a mold frame 2000 for fixing the light emitting device assembly 100 and the optical sheet 500. The light emitting device assembly 100 has a power line, a ground line, and a portion of a plurality of control lines are electrically insulated from one another, and a plurality of light emitting devices respectively branched and electrically insulated from one another. At least one of the light emitting chips and at least one of the driving chips are configured as a single package and mounted on the circuit board. The at least one light emitting chip is connected to the power line mounted on the circuit board and the at least one driving chip is connected to the ground line and the portion of the plurality of control lines mounted on the circuit board, so that the light emitting chips are connected to the driving chips. Accordingly, the driving chips operate according to the control signal applied to the control lines to supply the driving chips with power, thereby allowing the driving chips to emit light. To improve the quality of light emitted from the light emitting device assembly 100 and to increase the light efficiency, the optical sheet 500 may include a diffusion sheet 510 and a prism sheet 520. The diffusion sheet 510, which is disposed on the light emitting device assembly 100, uniformly diffuses the light emitted from the light emitting device assembly 100 and transfers the light toward the front of the prism sheet 520 and the liquid crystal display panel 3000, thereby increasing a viewing angle and suppressing bright spots, bright lines or smudges. The diffusion sheet 510 may be fabricated using a polycarbonate (PC) resin or a polyester (PET) resin. The prism sheet 520 reflects and condenses the light emitted from the diffusion sheet 510 to increase the brightness and allow the light to be incident into the liquid crystal display panel 3000. The prism sheet 520 may be fabricating by forming a band-shaped micro-prism PET on a base panel made of, e.g., polyester, and may be a couple of horizontal and vertical prism sheets.

The backlight unit driving unit 700 provides power for driving the plurality of light emitting devices included in the light emitting device assembly 100 and control signals for controlling the plurality of light emitting devices. The backlight unit driving unit 700 may include a field-programmable gate array (FPGA) 720, a driver 760, and a power supply unit 780. The FPGA 720 stores at least one lookup table, receives an image signal from an external video card through a transformation unit 600, and generates a signal for controlling driving of the plurality of light emitting devices by using the image signal. The driver 760 applies control signals for controlling the plurality of light emitting devices to each of the plurality of light emitting device blocks B of the light emitting device assembly 100 according to the signal output from the FPGA 720.

The FPGA 720 includes a signal distribution unit 721, a luminance control unit 722, a dimming control unit 723, and a memory unit 724. In the memory unit 724, at least one lookup table is stored for reference during luminance dimming of the light emitting device assembly 100. The signal distribution unit 721 receives the image signal through the transformation unit 600 and controls a gray scale of the image signal and timing of the image signal to apply the controlled image signal to a timing controller 4100 and a luminance control unit 722 of the liquid crystal display panel driving unit 4000. The luminance control unit 722 receives the gray data of the image signal from the signal distribution unit 721 and calculates a separate gray average for each of the plurality of liquid crystal display panel blocks A by using the received gray data. The luminance control unit 722 also calculates a pulse width for obtaining a suitable luminance of each of the plurality of liquid crystal display panel blocks A for the calculated gray average from the lookup table. The luminance control unit 722 also generates a luminance control signal including calculated pulse width information and provides the luminance control signal to the dimming control unit 723. The dimming control unit 723 outputs a dimming control signal for adjusting a control signal provided to each of the light emitting device blocks B of the light emitting device assembly 100 according to the luminance control signal input from the luminance control unit 722. The power supply unit 780 supplies power to the light emitting device assembly 100 through the power line and supplies power for generating a control signal to a modulation unit 740. The modulation unit 740 generates a control signal having a predetermined pulse width by using power supplied from the power supply unit 780, adjusts the pulse width of the control signal to adjust the luminance of each of the light emitting device blocks B according to the dimming control signal, and applies the adjusted control signal to the driver 760. The driver 760 drives each of the light emitting device blocks B according to the applied control signal. In other words, the control signal is applied to the driving chip of each of the light emitting devices through the driver 760 to drive the light emitting chip.

As described above, according to an embodiment of the present invention, at least one light emitting chip and at least one driving chip are configured in the same package, thereby forming each light emitting device. Formed light emitting devices are mounted on a circuit board where a power line, a ground line, and a plurality of control lines are formed, thereby forming a backlight unit.

In this way, a circuit structure is simplified when compared to conventional circuit structures where a light emitting diode and a driving unit are mounted on separate boards and are connected for use, thereby reducing production cost, reducing defects, and reducing the volume of a backlight unit. Moreover, by separately driving light emitting devices, power consumption can be further reduced.

While aspects of the present invention has been particularly shown and described with reference to exemplary embodiments thereof, it will be understood by those of ordinary skill in the art that various changes in form and details may be made therein without departing from the spirit and scope of embodiments of the present invention as defined by the following claims. It is therefore desired that exemplary embodiments be considered in all respects as illustrative and not restrictive, reference being made to the appended claims rather than the foregoing description to indicate the scope of the invention.

What is claimed is:

1. A backlight unit comprising:
   a circuit board;
   at least one internal interconnection formed on the circuit board; and
   a plurality of light emitting devices mounted on the circuit board to be connected with the at least one internal interconnection, each of the plurality of light emitting devices including at least one light emitting chip and at least one driving chip.

2. The backlight unit of claim 1, wherein the internal interconnection comprises:
   a power line supplying power to the plurality of light emitting devices;
   a ground line connecting the plurality of light emitting devices to a ground terminal; and
   a plurality of control lines providing control signals to the plurality of light emitting devices.

3. The backlight unit of claim 2, wherein each of the power line and the ground line is configured as a line to connect the plurality of light emitting devices.

4. The backlight unit of claim 2, wherein the plurality of control lines are connected with the plurality of light emitting devices, respectively.

5. The backlight unit of claim 1, wherein each of the plurality of light emitting devices comprises:
   at least one electrode terminal providing power and a control signal supplied from an external source to the light emitting chip and the driving chip;
   at least one interconnection connecting the light emitting chip, the driving chip, and the electrode terminal; and
   a molding unit encapsulating the light emitting chip and the driving chip.

6. The backlight unit of claim 5, wherein the driving chip comprises a switching device driven according to the control signal.

7. The backlight unit of claim 5, wherein the light emitting chip has a first electrode connected with the power line and a second electrode connected with a first electrode of the driving chip, and the driving chip has a second electrode connected with the ground line and a third electrode connected with the control line.

8. The backlight unit of claim 5, wherein the light emitting chip has a first electrode connected with the ground line and a second electrode connected with a first electrode of the driving chip, and the driving chip has a second electrode connected with the power line and a third electrode connected with the control line.

9. The backlight unit of claim 5, wherein the driving chip is driven according to the control signal wherein current flows between the power line and the ground line by means of the light emitting chip and the driving chip.

10. The backlight unit of claim 5, wherein the molding unit further comprises a fluorescent substance.

11. The backlight unit of claim 1, wherein each of the light emitting devices is configured as a single package by forming a light emitting chip and a driving chip on different boards.

12. The backlight unit of claim 1, wherein each of the light emitting devices is configured as a single package by forming a light emitting chip and a driving chip on the same substrate.

13. The backlight unit of claim 1, wherein for each of the light emitting devices, a plurality of light emitting chips and a plurality of driving chips are configured as a single package.

14. The backlight unit of claim 1, wherein for each of the light emitting devices, a plurality of light emitting chips and a plurality of driving chips are mounted on the circuit board and molded.

15. A backlight unit comprising:
   a circuit board;
   at least one internal interconnection formed on the circuit board;

a plurality of thin film transistors (TFTs) formed spaced apart from one another on a predetermined region of the circuit board and connected with the at least one internal connection; and a plurality of light emitting devices mounted on the circuit board to be connected with the at least one internal interconnection and the plurality of TFTs, each of the plurality of light emitting devices including at least one light emitting chip.

16. The backlight unit of claim 15, wherein the internal interconnection comprises:
    a power line supplying power to the plurality of light emitting devices;
    a ground line connecting the plurality of TFTs to a ground terminal; and
    a plurality of control lines providing control signals to the plurality of TFTs.

17. The backlight unit of claim 16, wherein each of the plurality of TFTs comprises:
    a gate electrode connected with the control lines;
    a source electrode connected with the light emitting devices; and
    a drain electrode connected with the ground terminal.

18. A display comprising:
    a display panel for displaying an image;
    a backlight unit including a plurality of light emitting devices mounted on a circuit board to be connected with at least one internal interconnection on the circuit board, each of plurality of light emitting devices including at least one light emitting chip and at least one driving chip, to provide light to the display panel; and
    a backlight unit driving unit supplying power to the backlight unit and adjusting a control signal provided to the backlight unit.

19. The display of claim 18, wherein each of the light emitting devices is configured as a single package by forming a light emitting chip and a driving chip on different boards.

20. The display of claim 18, wherein each of the light emitting devices is configured as a single package by forming a light emitting chip and a driving chip on the same substrate.

21. The display of claim 18, wherein for each of the light emitting devices, a plurality of light emitting chips and a plurality of driving chips are configured as a single package.

22. The display of claim 18, wherein for each of the light emitting devices, a plurality of light emitting chips and a plurality of driving chips are mounted on the circuit board and molded.

* * * * *